United States Patent [19]

Kumar

[11] Patent Number: 4,531,105
[45] Date of Patent: Jul. 23, 1985

[54] FREQUENCY MULTIPLIER CIRCUIT FOR PRODUCING ISOLATED ODD AND EVEN HARMONICS

[75] Inventor: Mahesh Kumar, Dayton, N.J.

[73] Assignee: RCA Corporation, Princeton, N.J.

[21] Appl. No.: 452,774

[22] Filed: Dec. 23, 1982

[51] Int. Cl.$^3$ .......................... H01P 5/16; H01P 1/213
[52] U.S. Cl. ..................................... 333/117; 333/110; 333/218
[58] Field of Search ...................... 307/219.1; 333/218, 333/110, 117, 132; 363/157, 159, 163, 166; 331/37, 42

[56] References Cited

U.S. PATENT DOCUMENTS

| | | | |
|---|---|---|---|
| 1,885,728 | 11/1932 | Keith | 363/157 |
| 3,161,780 | 12/1964 | Plügge et al. | 363/157 X |
| 3,329,884 | 7/1967 | Gewartowski | 307/219.1 |
| 3,571,739 | 3/1971 | Seidel | |

OTHER PUBLICATIONS

"Balanced Dual Gate GaAs FET Frequency Doublers", by Roger Stancliff, 1981 *IEEE MTT-S International Microwave Symposium Digest*.

"Extending Standard Sources Up to Millimeter Waves" by Richard S. Napier and Judi Cowell, Microwaves & RF, Dec. 1982.

*Primary Examiner*—Paul Gensler
*Attorney, Agent, or Firm*—Joseph S. Tripoli; Robert L. Troike; Raymond E. Smiley

[57] ABSTRACT

A 180° hybrid receptive of a fundamental frequency signal which may be adjusted over a range of frequencies produces the fundamental frequency signal at two output ports phased 180° apart. Each of the output ports is coupled to a non-linear active device which produces the fundamental frequency and odd and even harmonics thereof. A 180° and 0° hybrid is coupled to receive at respective input ports the signal from the active devices and to produce at one output port all the odd harmonics and to produce at the other output port all of the even harmonics of the fundamental frequency. The even and odd harmonics of the fundamental frequency appearing at the two output ports of the 0° and 180° hybrid are isolated from one another.

6 Claims, 2 Drawing Figures

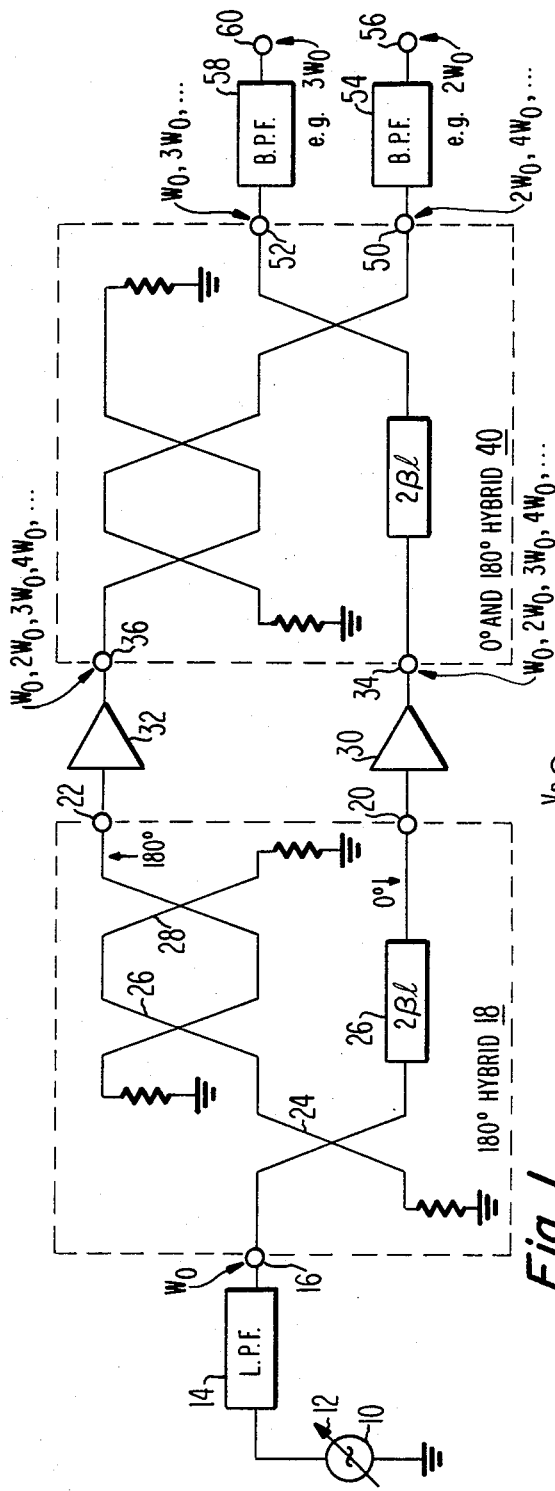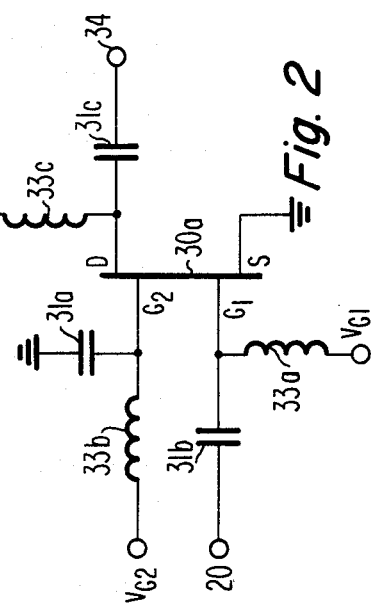

FREQUENCY MULTIPLIER CIRCUIT FOR PRODUCING ISOLATED ODD AND EVEN HARMONICS

BACKGROUND OF THE INVENTION

1. Field of the Invention

This invention relates to frequency multipliers and more particularly to frequency multipliers producing odd harmonics at one output port and even harmonics at a second output port.

2. Description of the Prior Art

Varactor diodes, Schottky barrier diodes and single and dual gate field effect transistor (FET) devices are each capable of producing harmonics of an applied microwave fundamental frequency signal. In each case the device is operated in its non-linear region to generate the harmonics. FETs have an advantage relative to diodes of providing gain and in particular dual-gate FETs provide better conversion gain and dynamic range than do single gate FETs. An article entitled "Balanced Dual Gate GaAs FET Frequency Doublers" by Roger Stancliff (1981, IEEE International Microwave Symposium Digest, Los Angeles, June 1981, pp. 143-145) reported on a frequency doubler which utilizes two dual gate FETs, an in phase power divider, an in-phase power combiner and a 180° delay which produces even harmonics while suppressing all odd harmonics including the fundamental.

SUMMARY OF THE INVENTION

In accordance with a preferred embodiment of the present invention, a frequency multiplier producing isolated even and odd harmonics at respective output ports of an input fundamental frequency comprises in combination, two active devices for producing odd and even harmonics of an input signal applied thereto, means coupled to receive the fundamental frequency input signal and coupled to the inputs of the two non-linear devices respectively, to provide thereto signals which are 180° out of phase relative to one another. The frequency multiplier further comprises means coupled to receive at respective input ports thereof signals from the outputs of the two non-linear devices and producing at one of two respective output ports signals which are odd harmonics of the input signal and at the other output port signals which are even harmonics of the input signal.

BRIEF DESCRIPTION OF THE DRAWING

FIG. 1 is a frequency multiplier in block and schematic form in accordance with a preferred embodiment of the present invention; and FIG. 2 is a particular non-linear device, a dual-gate FET, useful in the multiplier of FIG. 1.

DESCRIPTION OF THE PREFERRED EMBODIMENT

Referring to FIG. 1, microwave frequency signal source 10, of conventional design, which may be adjustable in frequency as symbolized by arrow 12, is coupled to a low pass filter 14. Signal source 10 may, for example, produce signals adjustable from 8-12 Gigahertz (GHz). Then low pass filter 14 would pass a signal of fundamental frequency $\omega_0$ up to 12 Ghz and reject signals above that frequency. Such low pass filters are described by G. L. Matthaei, L. Young and E. M. T. Jones in chapters 4 and 7, "Microwave Filters, Impedance-Matching Networks, and Coupling Structures" Artech House, 1980. The output of low pass filter 14 is coupled to input port 16 of a 180° hybrid 18. One such 180° hybrid 18 is described in U.S. Pat. No. 4,394,629 issued July 19, 1983 on application Ser. No. 249,609 filed Mar. 31, 1981 by M. Kumar, et al and in an article by M. Kumar, et al, "Planar Broad-Band 180° Hybrid Power Divider/Combiner Circuit", IEEE Transactions on Microwave Theory and Techniques, Vol. MTT-29, No. 11, pp. 1233-1235, November 1981.

Hybrid 18 produces at its two output ports 20 and 22 signals which are 180° out of phase relative to one another. In a particular type of 180° hybrid described in the aforementioned application, three 90° hybrids 24, 26 and 28 are arranged as illustrated in FIG. 1 herein. Additionally a delay line 26 compensates for the difference in delay from 90° hybrid 24 to output port 20 relative to the otherwise existing delay between 90° hybrid 24 and output port 22.

Any other type of device which produces 180° relative phase shift between its two output ports to a signal supplied at an input port in the frequency range of interest would be suitable. Thus, another such 180° divider is described in U.S. Pat. No. 3,748,601 issued July 24, 1973 to Harold Seidel.

Output port 20 of hybrid 18 is coupled to a non-linear active device 30 which is capable of producing harmonics of a signal of fundamental frequency $\omega_0$ including frequency $\omega_0$ applied thereto, that is, of value or values produced by source 10. Examples of such devices are varactor diodes, Schottky barrier diodes, single-gate FETs and dual-gate FETs. In particular, a dual-gate FET 30a such as Model number 46300 manufactured by Nippon Electric Company of Japan illustrated in FIG. 2 and biased to operation in its nonlinear current vs. voltage ranges is a suitable device 30 for use in producing harmonics. In FIG. 2 capacitor 31a extending between second gate G2 and system ground is an RF bypass capacitor. Capacitor 31b extending between input terminal 20 and gate G, and capacitor 31c extending between drain D and output terminal 34 are DC blocking capacitors. A bias choke 33a extends between gate 1 bias terminal $V_{G1}$ and gate $G_1$. A bias choke 33b extends between gate 2 bias terminal $V_{G2}$ and gate $G_2$. A bias choke 33c extends between drain bias terminal $V_D$ and the drain D. Output port 22 is coupled to a device 32 which is similar to device 30.

Devices 30 and 32 are coupled via their drain electrodes, for example, to respective input ports 34 and 36 of a 0° and 180° hybrid 40. Hybrid 40 may be of the type described in the aforementioned U.S. patent application and article by M. Kumar et al and therefore is identical to hybrid 18 only arranged in mirror image fashion. Hybrid 40 includes two output ports 50 and 52. Hybrid 40 combines the signals at ports 34 and 36 such that output port 50 produces signals which are the even harmonic components of signals applied at ports 34 and 36 while port 52 produces signals which are the odd harmonic components and fundamental frequency $\omega_0$ of signals applied at ports 34 and 36. The signals appearing at ports 50 and 52 are isolated from one another. In practice the isolation is not perfect and is of the order of 20 dB. The term "isolated" is understood to include some non-isolation as occurs in practical devices.

Port 50 may be coupled to a bandpass filter 54 to eliminate unwanted even harmonics. Thus, for example, bandpass filter 54 may pass signal to output terminal 56 which is twice the input fundamental frequency $\omega_0$. Similarly, port 52 may be coupled to a bandpass filter such as 58 to produce a desired output frequency such as, for example, $3\omega_0$ at output terminal 60. Bandpass filters may be of the type described in chapters 8, 9 and 10 of the aforementioned book by G. L. Matthaei et al.

The equations which govern the operation of the frequency multiplier circuit are listed in chapter 8 on varactor applications of the book "Microwave Semiconductor Devices and Their Applications", edited by H. A. Watson McGraw Hill, 1969 and are as follows. Relative to signal input at either port 20 or port 22, the output signal current from amplifier 30 to port 34 or from amplifier 32 to port 36 is:

$$i = 2I_1 \cos(\omega_0 t + \theta_1) + 2I_2 \cos(2\omega_0 t + \theta_2) + \quad (1)$$

$$2I_3 \cos(3\omega_0 t + \theta_3) + 2I_4 \cos(4\omega_0 t + \theta_4) + \ldots$$

where $I_1$, $I_2$, $I_3$, etc. are the magnitudes respectively of the fundamental second, third . . . harmonics, $\omega_0$ is the fundamental angular frequency, $\theta_1$, $\theta_2$, $\theta_3$, etc. are the phases respectively of the fundamental, second harmonic, third harmonic, etc. caused by operation of multiplier devices 30 and 32.

The signal current $i_1$ between amplifier 30 and port 34 relative to the input signal of port 16 is the same as equation 1 above. The signal current between amplifier 32 and port 36 relative to the input port signal at port 16 is:

$$i_2 = 2I_1 \cos[(\omega_0 t + \pi) + \theta_1] + 2I_2 \cos[2(\omega_0 t + \pi) + \theta_2] + \quad (2)$$

$$2I_3 \cos[3(\omega_0 t + \pi) + \theta_3] +$$

$$2I_4 \cos[4(\omega_0 t + \pi) + \theta_4] + \ldots$$

The expression for $i_2$, the current at the output of amplifier 32, can be rewritten as:

$$i_2 = -2I_1 \cos(\omega_0 t + \theta_1) + 2I_2 Y \cos(2\omega_0 t + \theta_2) \quad (3)$$

$$-2I_3 \cos(\omega_0 t + \theta_3) + 2I_4 \cos(4\omega_0 t + \theta_4) - \ldots$$

By comparing equations (1) and (3) it will be noted that the odd harmonic terms (including the fundamental) $\omega_0$, $3\omega_0$, $5\omega_0$, etc. are out of phase (180° phase difference) while the even harmonic terms ($2\omega_0$, $4\omega_0$ . . . ) are in phase. In FIG. 1, the in-phase signals combine at port 50 while the out of phase signals combine at port 52. The odd harmonic signals may be passed to a band pass filter 58 which can be said to pass any given range of frequencies. e.g., the third harmonic or those signals at $3\omega_0$, while the even harmonic signals can be passed to a bandpass filter 54 which may be set to pass only those at the second harmonic, for example, that is, $2\omega_0$. Thus, if the input frequency from source 10 is adjustable, for example, from 8 to 12 GHz, then there will be produced at terminal 56 signals in the range from 16 to 24 GHz while there will be produced at output terminal 60 signals ranging in frequency from 24 to 36 GHz. The signals produced at terminals 56 and 60 may be used individually in appropriate equipment, such as communications equipment or test equipment, or the signals may be combined to thus produce a combined signal which ranges from 16 to 36 GHz.

The principles of the invention may be employed at even higher frequencies, including those in the millimeter wave region. In such a case, it may be desirable or mandatory that hybrid 40 be replaced by a waveguide structure suitable for combining in-phase and out-of-phase signals. One such known structure called the "magic T" is thus suitable for use as an element in block 40 where millimeter waves are to be generated. Similarly, if the input frequency from source 10 is sufficiently high, it may be desirable or mandatory that hybrid 18 may also be of the waveguide type such as a Magic T.

What is claimed is:

1. A microwave frequency multiplier for producing isolated odd and even harmonics of an input signal at a fundamental frequency, comprising in combination:
    a 180° hybrid receptive at an input port of said input signal for producing at first and second output ports thereof a signal at the fundamental frequency, the signal at the output ports being phased 180° apart;
    first and second non-linear active devices, each having an input terminal coupled to a respective one of said first and second output ports and having an output terminal for producing a signal at said fundamental frequency and even and odd harmonics thereof; and
    a 0° and 180° hybrid having first and second input ports coupled respectively to the respective output terminals of said first and second devices and having two output ports for producing at one of said output ports a signal containing only the fundamental frequency and odd harmonics thereof and for producing at the other output port a signal containing only the even harmonics of the fundamental frequency.

2. The combination as set forth in claim 1 wherein each said non-linear active device is a transistor.

3. The combination as set forth in claim 1 wherein each said non-linear active device is a dual-gate field effect transistor.

4. The combination as set forth in claim 1 further including a bandpass filter coupled to each of said two output ports of said 0° and 180° hybrid, one filter tuned to pass one of said odd harmonics produced by its respective output port of said 0° and 180° hybrid and one tuned to pass one of said even harmonics of those harmonics produced by the respective output port of said 0° and 180° hybrid.

5. The combination as set forth in claim 1 further including a low pass filter positioned between said source of fundamental frequency signal and said 180° hybrid input port for passing to said 180° hybrid a signal at or below said fundamental frequency.

6. The combination as set forth in claim 5 further including a bandpass filter coupled to each of said two outport ports of said 0° and 180° hybrid, one filter tuned to pass one of said odd harmonics produced by its respective output port of said 0° and 180° hybrid and one tuned to pass one of said even harmonics of those harmonics produced by the respective output port of said 0° and 180° hybrid.

* * * * *